(12) United States Patent
Rossi

(10) Patent No.: US 8,645,094 B2
(45) Date of Patent: Feb. 4, 2014

(54) ACCURATE GAIN IMPLEMENTATION IN CMOS SENSOR

(75) Inventor: Giuseppe Rossi, Los Angeles, CA (US)

(73) Assignee: AltaSens, Inc., Westlake Village, CA (US)

( * ) Notice: Subject to any disclaimer, the term of this patent is extended or adjusted under 35 U.S.C. 154(b) by 1536 days.

(21) Appl. No.: 11/765,898

(22) Filed: Jun. 20, 2007

(65) Prior Publication Data

US 2008/0316342 A1 Dec. 25, 2008

(51) Int. Cl.
*G06F 3/05* (2006.01)
*H04N 5/30* (2006.01)

(52) U.S. Cl.
USPC .......................................... 702/107; 348/187

(58) Field of Classification Search
USPC .................................... 702/107; 348/294, 187
See application file for complete search history.

(56) References Cited

U.S. PATENT DOCUMENTS

| | | | |
|---|---|---|---|
| 4,660,082 A | | 4/1987 | Tomohisa et al. |
| 5,677,962 A | * | 10/1997 | Harrison et al. ............... 381/109 |
| 6,032,109 A | * | 2/2000 | Ritmiller, III .................. 702/104 |
| 6,618,173 B1 | * | 9/2003 | Nobel et al. .................... 358/513 |
| 6,788,340 B1 | * | 9/2004 | Chen et al. .................. 348/229.1 |
| 6,829,007 B1 | | 12/2004 | Bilhan et al. |
| 6,965,395 B1 | * | 11/2005 | Neter ............................. 348/129 |
| 7,085,334 B2 | * | 8/2006 | Burke et al. ................... 375/345 |
| 7,161,418 B2 | * | 1/2007 | Boos ................................. 330/2 |
| 7,498,882 B2 | * | 3/2009 | Dally et al. .................... 330/279 |
| 2003/0052803 A1 | | 3/2003 | Engl et al. |
| 2004/0102914 A1 | * | 5/2004 | More .............................. 702/99 |
| 2006/0027733 A1 | * | 2/2006 | Terzioglu et al. ........... 250/208.1 |
| 2006/0262210 A1 | * | 11/2006 | Smith et al. ................... 348/308 |

FOREIGN PATENT DOCUMENTS

EP  0 450 525 A  10/1991

OTHER PUBLICATIONS

International Search Report and Written Opinion for PCT Application No. PCT/ US2008/ 065633, mailed Sep. 3, 2008, 13 pages.

* cited by examiner

*Primary Examiner* — Michael Nghiem
*Assistant Examiner* — Alexander Satanovsky
(74) *Attorney, Agent, or Firm* — Turocy & Watson, LLP

(57) ABSTRACT

The claimed subject matter provides systems and/or methods that facilitate combining analog and digital gain for utilization with CMOS sensor imagers. The analog gain can provide coarse gain steps and the digital gain can provide finer gain steps between adjacent coarse analog gain values. Further, since analog gain can suffer from low precision, dispersion, etc., on-chip calibration can be implemented to calibrate the analog and digital gain. For example, a digital amplifier can be calibrated to compensate for differences between actual and nominal analog gains associated with one or more analog amplifiers.

20 Claims, 14 Drawing Sheets

ACCURATE GAIN IMPLEMENTATION IN CMOS SENSOR

BACKGROUND

Recent technological advances have led to CMOS sensor imagers being leveraged by cameras, video systems, and the like. CMOS sensor imagers can include an integrated circuit with an array of pixel sensors, each of which can comprise a photodetector. The signal from the pixel array oftentimes can be amplified by one or more on-chip analog amplifiers. The analog amplifiers can provide gain granularity and range to match requirements of sophisticated camera functions such as, for instance, automatic gain control (AGC) and white balance (WB), while also optimizing dynamic range and noise performance of the CMOS sensor imagers.

Variations in the fabrication process oftentimes can cause non-uniform operation of the CMOS sensor imagers. For instance, CMOS sensor imagers in disparate fabrication lots or within large batches can exhibit operating variation. Moreover, performance of CMOS sensor imagers can vary over a period of time (e.g., due to changes in temperature, humidity, ... ). According to an illustration, non-uniformity in operation can result from process tolerances of analog components included with the CMOS sensor imagers.

By way of example, on-chip analog amplifiers can lead to operation variations. Since analog amplifiers typically can be implemented using a selectable array of analog capacitors, such amplifiers can suffer from limited gain precision, gain step size dispersion, non-monotonic behavior and chip-to-chip gain dispersion. The foregoing are significant limitations that can become increasingly onerous as the analog step size is reduced. For instance, the step size can be decreased from 3 dB to 0.1 dB, and thus, the size of the smallest analog capacitor implemented in the analog stage can be decreased by 32 times. Such a reduction of the geometrical dimension of the analog capacitor can compromise its precision. For high performance applications such as the next generation of hybrid camcorders, even finer gain step sizes can be employed (e.g., on the order of 0.1 dB to 0.01 dB). Since monotonic behavior and adequate chip-to-chip uniformity are also desired features, conventional analog amplifiers associated with CMOS sensor imagers commonly can be ineffective for providing small gain step sizes.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

The claimed subject matter relates to systems and/or methods that facilitate combining analog and digital gain for utilization with CMOS sensor imagers. The analog gain can provide coarse gain steps and the digital gain can provide finer gain steps between adjacent coarse analog gain values. Further, since analog gain can suffer from low precision, dispersion, etc., on-chip calibration can be implemented to calibrate the analog and digital gain. For example, a digital amplifier can be calibrated to compensate for differences between actual and nominal analog gains associated with one or more analog amplifiers.

In accordance with various aspects of the claimed subject matter, an analog amplifier and a digital amplifier can operate in conjunction to provide optimized dynamic range and noise performance (e.g., associated with the analog amplifier) and fine step size with high precision and reproducibility (e.g., associated with the digital amplifier) for a CMOS sensor imager. Moreover, the analog amplifier can introduce gain discontinuity, dispersion, lack of precision, etc., which can be compensated for by the digital amplifier. Further, a feedback component can control calibration of the digital amplifier based upon comparisons of actual analog gains with nominal analog gains. For example, calibration can be performed by the feedback component during a chip startup sequence, after a predetermined amount of operating time, upon occurrence of a condition, event, and the like, during chip production, etc.

The following description and the annexed drawings set forth in detail certain illustrative aspects of the claimed subject matter. These aspects are indicative, however, of but a few of the various ways in which the principles of such matter may be employed and the claimed subject matter is intended to include all such aspects and their equivalents. Other advantages and novel features will become apparent from the following detailed description when considered in conjunction with the drawings.

DETAILED DESCRIPTION

Figure 1:
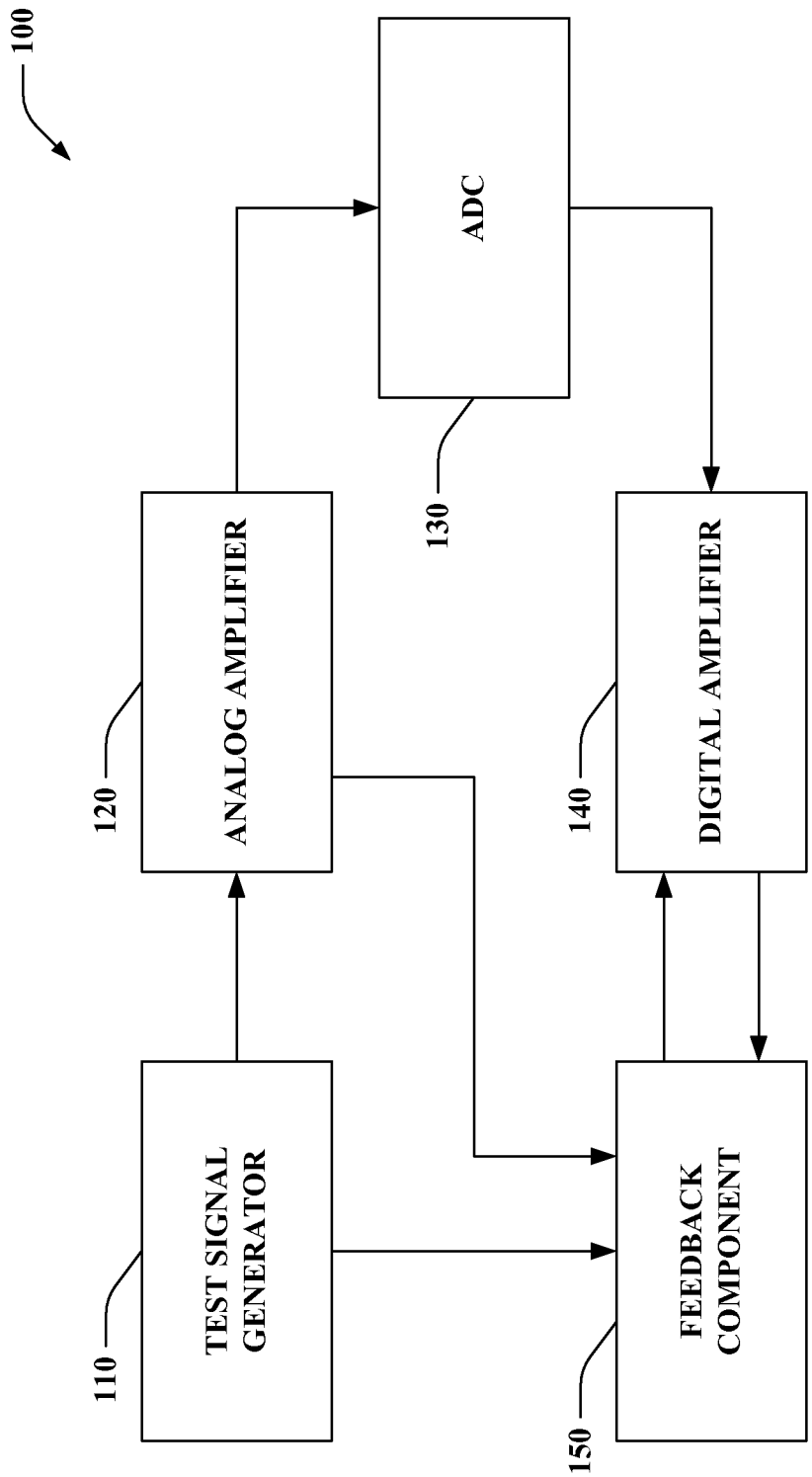
FIG. 1 illustrates a block diagram of an example system that calibrates gain associated with a CMOS sensor imager.

The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

As utilized herein, terms "component," "system," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips, . . . ), optical disks (e.g., compact disk (CD), digital versatile disk (DVD), . . . ), smart cards, and flash memory devices (e.g., card, stick, key drive, . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter. Moreover, the word "exemplary" is used herein to mean serving as an example, instance, or illustration. Any aspect or design described herein as "exemplary" is not necessarily to be construed as preferred or advantageous over other aspects or designs.

With reference to FIG. 1, illustrated is a system 100 that calibrates gain associated with a CMOS sensor imager. The system 100 combines analog and digital gain; accordingly, advantages typically associated with analog amplifiers such as optimized dynamic range and noise performance can be yielded by the system 100 along with common advantages of digital amplifiers such as fine step size with high precision and reproducibility. Moreover, the system 100 can accept dispersion generated by analog components, and compensate for such dispersion by implementing a correction algorithm that controls digital components of the system 100. After the correction algorithm, sensor gains can be aligned with greater precision as compared to conventional sensors that typically employ solely analog components. The system 100 can be associated with a CMOS sensor imager utilized in connection with a camcorder, digital camera, microscope, video system, and the like.

The system 100 can include a test signal generator 110 that yields one or more reference voltages employed for calibration. It is to be appreciated that the test signal generator 110 can be included on a chip with the CMOS sensor imager (and the corresponding amplifiers). According to another example, the test signal generator 110 can be a stand alone device or included within a separate device that provides reference voltage(s); thus, the CMOS sensor imager can receive such input reference voltage(s), which can be employed in connection with calibration of the gain. By way of illustration, the test signal generator 110 can output an analog reference voltage. Additionally or alternatively, it is contemplated that a digital signal corresponding to the reference voltage can be yielded by the test signal generator 110; hence, a digital-to-analog converter (DAC) (not shown) can be employed to convert the digital signal to an analog signal. While the test signal generator 110 provides the reference voltages (e.g., during calibration), disparate components of the CMOS sensor imager can be disabled; for example, the reference voltages yielded by the test signal generator 110 can substitute for signals commonly obtained by a pixel array (not shown) of the CMOS sensor imager while the system 100 is operating in a calibration mode.

An analog amplifier 120 can obtain the reference voltage(s) (e.g., test signal(s)) and amplify (and/or attenuate) such input voltage(s) to yield corresponding output voltage(s). Although one analog amplifier 120 is depicted, it is to be appreciated that substantially any number of analog amplifiers can be employed in combination. The analog amplifier 120 can provide a fixed and/or adjustable amount of gain. According to an illustration, the amount of gain yielded by the analog amplifier 120 can be selectable (e.g., based upon an input, an operation, a monitored condition, a program, . . . ). The analog amplifier 120 can generate coarse gain steps, for instance, on the order of 1 dB to 3 dB. Further, the analog amplifier 120 can have substantially any gain range (e.g., 0 dB to 24 dB, . . . ). Moreover, the analog amplifier 120 can introduce a lack of precision and/or dispersion while amplifying the input voltage(s). For example, the analog amplifier 120 can generate an output voltage from a corresponding input voltage as follows: $V_{out}=Gain\times(V_{in}+Offset)$. It is to be appreciated that the analog amplifier 120 can have gain mismatch and/or offset mismatch, and therefore, the gain and/or the offset can vary between chips, sensors, lots, and the like. The output voltage from the analog amplifier 120 can thereafter be quantized by an analog-to-digital converter (ADC) 130. Accordingly, the ADC 130 can produce a digital output corresponding to the amplified voltage provided by the analog amplifier 120.

The system 100 can also include a digital amplifier 140 that can obtain the digital output from the ADC 130 and adjust the gain to compensate for mismatch (e.g., gain mismatch, offset mismatch, . . . ) introduced by the analog amplifier 120; for example, the digital amplifier 140 can both be calibrated to compensate for mismatch associated with the analog amplifier 120 (e.g., mitigate the difference between actual and nominal analog gain) as well as provide fine digital gain steps between adjacent analog gain steps. The digital amplifier 140 can provide fine gain granularity, precision, reproducibility and range. For instance, the digital amplifier 140 can provide an adjustable, digital gain. Moreover, the digital gain can be utilized to provide a fine gain step (e.g., up to 0.001 dB) in between two adjacent coarse analog gain values. Accordingly, the use of the digital amplifier 140 can be restricted to a limited range (e.g., with a maximum range substantially similar to a gain step size provided by the analog amplifier 120 such as on the order of 1 dB to 3 dB); thus, sensor performance and resultant image quality may not be compromised by utilizing digital amplification in comparison to conventional digital amplifiers that can yield degraded noise performance and sensor dynamic range.

A feedback component 150 controls operation of the digital amplifier 140. The feedback component 150 can enable on-chip calibration of the gain generated by the analog amplifier 120 and/or the digital amplifier 140. For example, the on-chip calibration effectuated by the feedback component 150 can be performed as part of a chip power up sequence.

Additionally or alternatively, the feedback component 150 can initiate calibration after a fixed amount of sensor operating time to remove potential drift due to temperature, bias transient, and so forth. According to another illustration, calibration can be effectuated during production; thus, offline calibration by the feedback component 150 can be performed.

The feedback component 150 can control calibration of the digital amplifier 140 based upon data obtained from the test signal generator 110 (e.g. reference voltage(s)), the analog amplifier 120 (e.g., nominal gain), the ADC 130 (not shown), and/or the digital amplifier 140. By way of illustration, the feedback component 150 can receive information corresponding to a reference voltage provided by the test signal generator 110. Additionally, the feedback component 150 can obtain information corresponding to the output voltage generated by the analog amplifier 120 (and/or the corresponding digitized output provided by the ADC 130). Further, the feedback component 150 can receive control information from the analog amplifier 120 pertaining to a nominal gain step. Moreover, the feedback component 140 can obtain the digitized output from the digital amplifier 140; the digitized output can enable determining the actual gain yielded by the system 100, which can be compared to the nominal gain.

The feedback component 150 can calibrate the digital amplifier 140 based upon any number of reference voltages provided by the test signal generator 110 for a particular analog gain setting (e.g., nominal gain). For instance, a plurality of reference voltages and corresponding digitized outputs from the digital amplifier 140 can be evaluated by the feedback component 150 to allow for differential gain calibration since the analog amplifier 120 can have gain mismatch as well as offset mismatch in comparison to disparate analog amplifiers. The offset mismatch results in the analog amplifier 120 having a slightly different output voltage based upon a reference voltage of zero. The feedback component 150 can correct excessive analog gain or lack of analog gain by adjusting the digital gain yielded by the digital amplifier 140. For example, the feedback component 150 can employ linear regression to determine an actual gain yielded the analog amplifier 120 for each nominal gain step of the analog amplifier 120. Moreover, the feedback component 150 can calculate corrective coefficients for digital gain adjustments provided by the digital amplifier 140 utilized to calibrate the analog amplifier 120 based upon differences between actual gains and corresponding nominal gains; such corrective coefficients can be employed by the digital amplifier 140 during operation of the CMOS sensor imager.

Although not shown, it is contemplated that the feedback component 150 can control operation of the test signal generator 110 and/or the analog amplifier 120 during calibration. For example, the feedback component 150 can select the reference voltage to be output by the test signal generator 110. By way of another illustration, the feedback component 120 can choose the nominal gain to be employed by the analog amplifier 120; however, it is to be appreciated that the claimed subject matter is not so limited.

Figure 2:
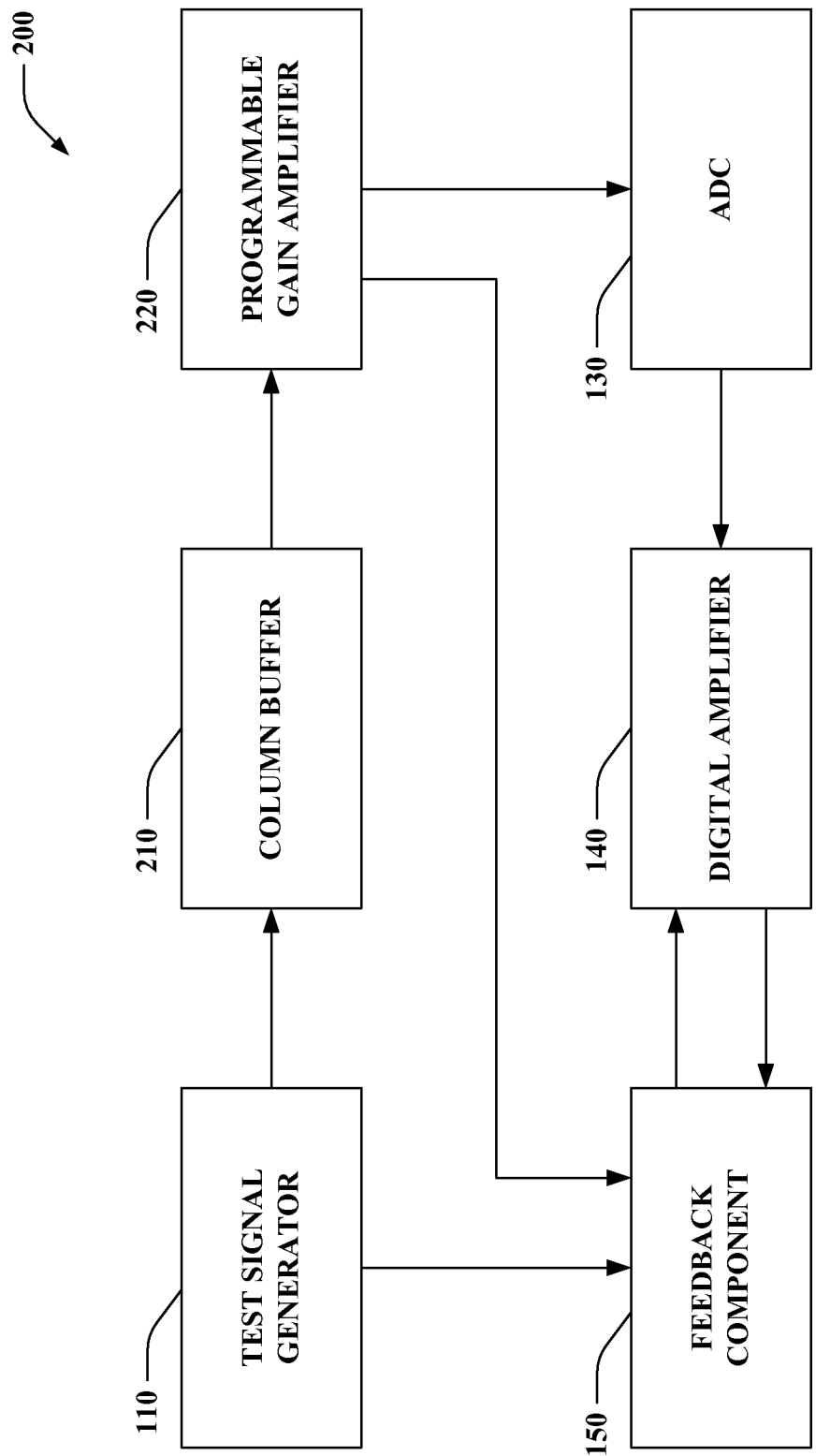
FIG. 2 illustrates a block diagram of an example system that controls digital gain compensation where a plurality of analog amplifiers is employed with a CMOS sensor imager.

Turning to FIG. 2, illustrated is a system 200 that controls digital gain compensation where a plurality of analog amplifiers is employed with a CMOS sensor imager. The system 200 can include the test signal generator 110 that yields reference voltage(s), which can be provided to the plurality of analog amplifiers. In particular, the system 200 can include two analog amplifiers, namely, a column buffer 210 and a programmable gain amplifier 220. The amplified output from the programmable gain amplifier 220 can thereafter be digitized by the ADC 130. Moreover, the digital amplifier 140 can adjust for excess or lack of analog gain and the feedback component 150 can calibrate gain within the system 200 (e.g., by controlling operation of the digital amplifier 140).

The CMOS sensor imager can include an array of pixels with M rows and N columns, where M and N can be substantially any integers. Moreover, signals from the pixels can be processed on a column by column basis. Each column of pixels can be associated with a respective column buffer (e.g., the column buffer 210); accordingly, the CMOS sensor imager can include N column buffers. The column buffer 210 can enable low noise readout and can condition the signal from a pixel positioned at one of the rows in the column corresponding to the column buffer 210.

The output from each column buffer (e.g., the column buffer 210) can thereafter be amplified by the programmable gain amplifier 220. The programmable gain amplifier 220 can amplify the output from each of the column buffers one at a time. Moreover, a common programmable gain amplifier (e.g., the programmable gain amplifier 220) can be utilized in connection with amplifying the output of each of the column buffers; however, it is contemplated that more than one programmable gain amplifier can be employed in connection with the system 200. Moreover, the resultant output from the programmable gain amplifier 220 can have an output voltage, $V_{out} = G_{PGA}(G_{CB}V_{in} + \text{Offset}_{CB}) + \text{Offset}_{PGA}$, where $G_{PGA}$ is the gain from the programmable gain amplifier 220, $G_{CB}$ is the gain from the column buffer 210, $V_{in}$ is the input voltage (e.g., reference voltage) yielded by the test signal generator 110, $\text{Offset}_{CB}$ is the offset introduced by the column buffer 210, and $\text{Offset}_{PGA}$ is the offset introduced by the programmable gain amplifier 220.

The output analog signal from the programmable gain amplifier 220 can be digitized with the ADC 130 and thereafter input to the digital amplifier 140. The digital amplifier 140 can adjust the gain with fine step size alterations to the digitized input. Such alterations can have high precision and reproducibility. Moreover, the feedback component 150 can modify operation of the digital amplifier 140 (e.g. during calibration) based upon the output of the digital amplifier 140, the reference voltage yielded by the test signal generator 110, the nominal gain utilized by the programmable gain amplifier 220, a combination thereof, and the like. For example, the feedback component 150 can generate corrective coefficients for each analog amplifier (e.g., any number of column buffers such as the column buffer 210, the programmable gain amplifier 220, . . . ) during a calibration mode, and the corrective coefficients can be used during operation of the CMOS sensor imager.

Figure 3:
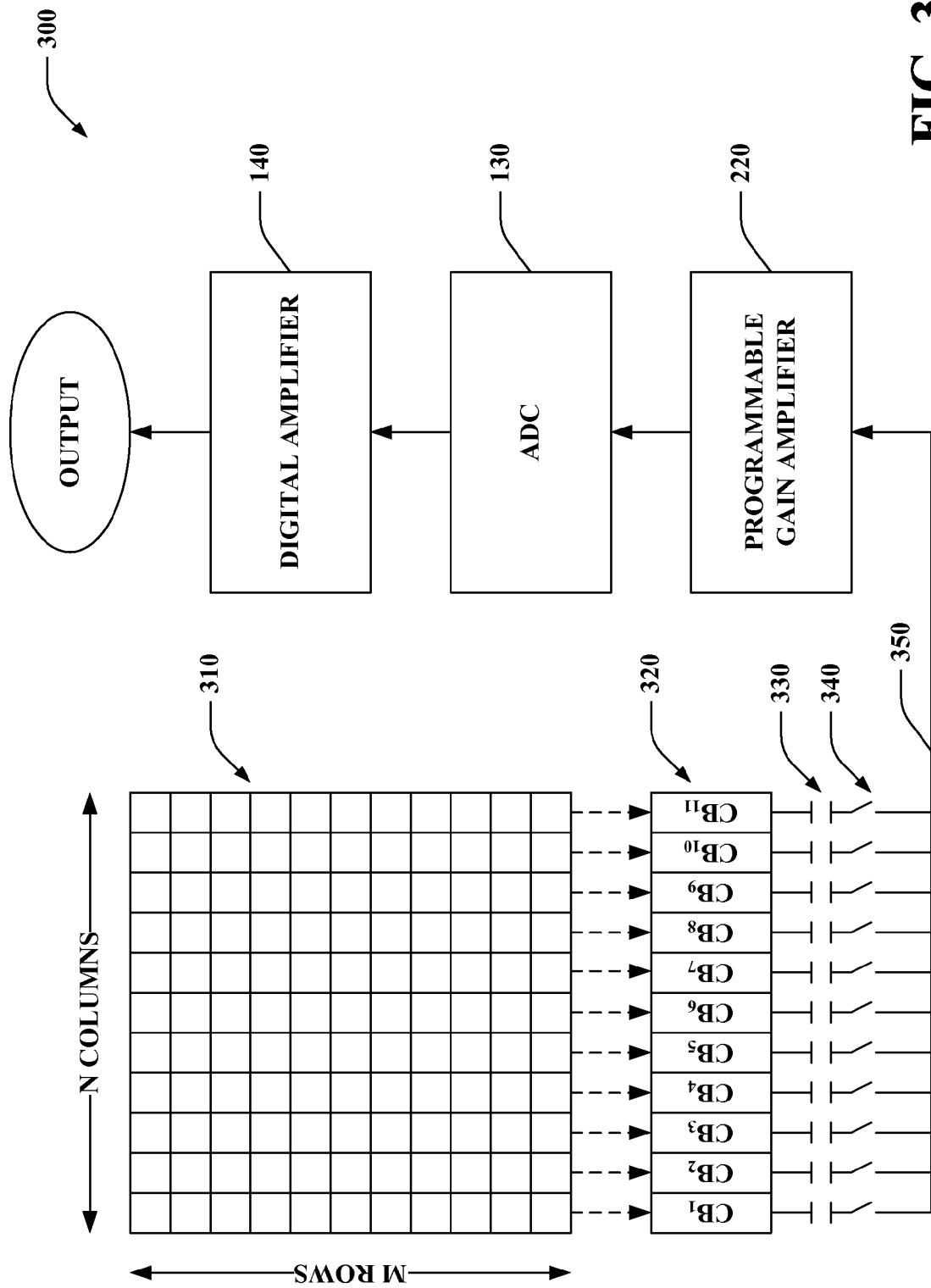
FIG. 3 illustrates a block diagram of an example system that employs calibrated amplifier(s) in connection with a CMOS sensor imager.

Referring now to FIG. 3, illustrated is a system 300 that employs calibrated amplifier(s) in connection with a CMOS sensor imager. The system 300 includes a pixel array 310 that can include M rows and N columns, where M and N can be any integers. Each pixel in the pixel array 310 can comprise a photodetector (e.g., a photodiode). Signals obtained by the pixel array 310 can be processed on a column by column basis; thus, a particular row of pixels from the pixel array 310 can be selected to be read. System 300 can include N column buffers 320, where each of the column buffers 320 operates in conjunction with a respective column from the pixel array 310. Although eleven column buffers 320 are depicted, it is to be appreciated that substantially any number of column buffers similar to the column buffers 320 can be employed in connection with the system 300. The content from the pixels in each of the columns of the selected row can be transferred to the corresponding column buffers 320, and the column buffers 320 can amplify (e.g., condition) the signals from the pixels.

After processing by the column buffers 320, outputted values from each of the column buffers 320 can be retained. Moreover, each of the column buffers 320 can be associated with a respective capacitor 330 and switch 340. The capacitors 330 can be loaded with the outputted values from the corresponding column buffers 320. Further, the switches 340 can be closed one at a time to allow for connecting to a bus 350; thus, the voltages generated by the column buffers 320 can be multiplexed over the bus 350. The bus 350 can enable communicating each of the outputted values from the respective column buffers 320 to the programmable gain amplifier 220, which can thereafter amplify the signal. The output from the programmable gain amplifier 220 can then be digitized by the ADC 130. Additionally, the digital amplifier 140 can digitally amplify the digitized signal as calibrated to yield an output. The digital amplifier 140 can adjust the output from the column buffers 320 and the programmable gain amplifier 220 to remove gain discontinuities introduced by the respective analog components utilized in connection with particular digitized signals; for example, the digital amplifier 140 can correct dispersion values associated with the analog gains by amplifying (positive) and/or attenuating (negative) gain values (e.g., −3 dB to +3 dB digital gain range). Moreover, the digital amplifier 140 can amplify (or attenuate) the digitized signal obtained from the ADC 130 with fine digital gain steps (e.g., to provide gain with greater precision in between analog gain steps).

Figure 4:
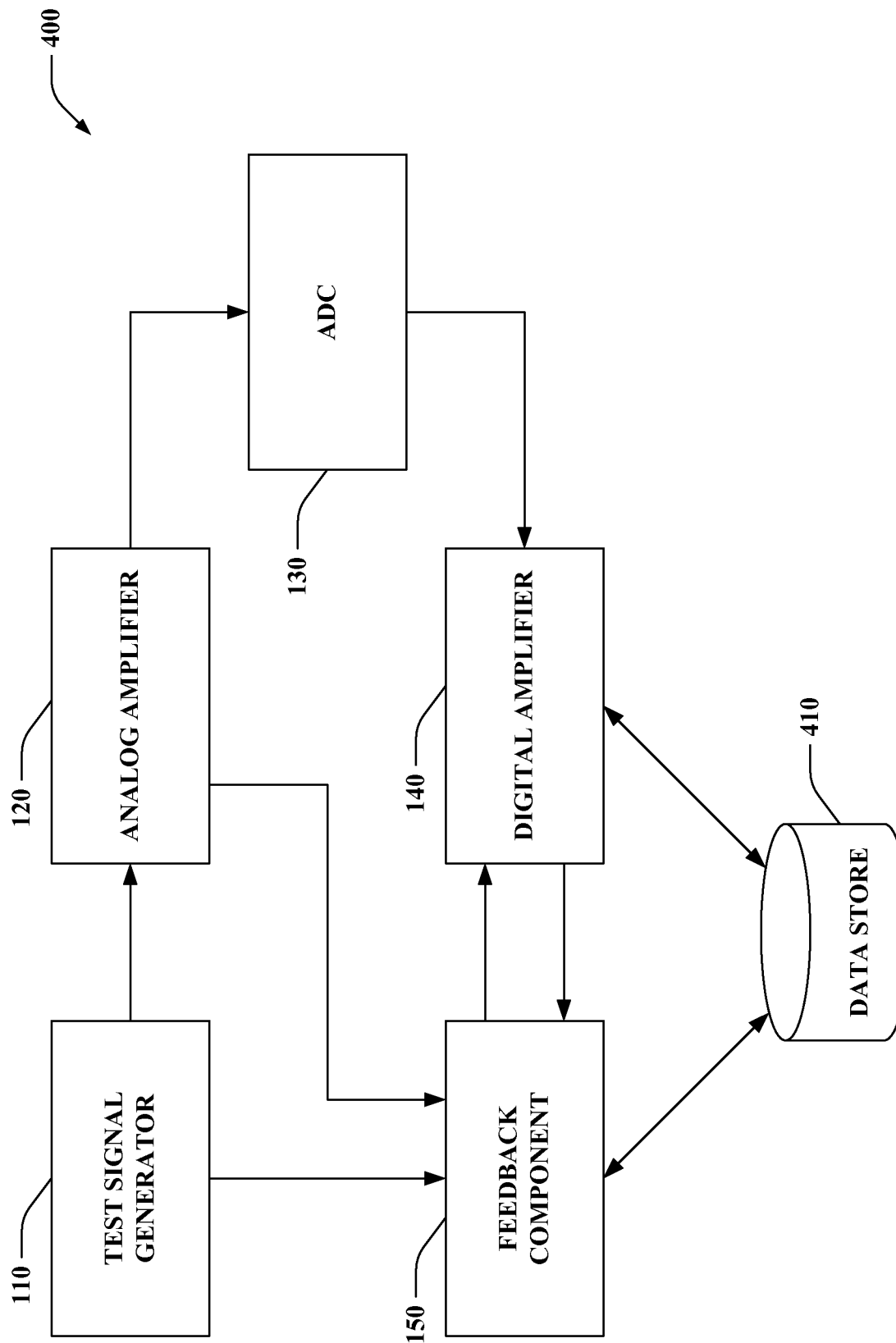
FIG. 4 illustrates a block diagram of an example system that retains and/or employs retained calibration data in connection with a CMOS sensor imager.

Turning to FIG. 4, illustrated is a system 400 that retains and/or employs retained calibration data in connection with a CMOS sensor imager. The system 400 can include the test signal generator 110, the analog amplifier 120, the ADC 130, the digital amplifier 140, and/or the feedback component 150 as described above. Further, the system 400 can include a data store 410 that can store calibrated gain values to be employed by the digital amplifier 140. For example, during calibration, the feedback component 150 can retain the calibrated gain values in the data store 410. Moreover, during operation, the calibrated gain values can be retrieved by the digital amplifier 140 from the data store 410; for instance, the digital gain can be coupled to the analog gain in a lookup table retained in the data store 410 such that gain discontinuities can be removed. Pursuant to an example, calibration can be effectuated by the feedback component 150 during production to yield calibration coefficients; these calibration coefficients can be stored in the data store 410 in a lookup table for utilization (e.g., by the digital amplifier 140, . . . ) during operation. According to another illustration, the feedback component 150 can perform calibration during a power up sequence to yield a set of calibration values that can be locally and temporarily retained in the data store 410. Moreover, temporarily stored calibration values can be updated during operation to enable readjustment (e.g., after a predetermined number of cycles, upon identifying a condition, . . . ).

According to an example, a dedicated calibration coefficient can be calculated for each column buffer in the sensor by the feedback component 150. For instance, for a sensor that includes 1000 column buffers, 1000 calibration coefficients can be computed per each gain setting. Pursuant to another illustration, the computational load can be lessened. Following this illustration, rather than calibrating the gain of each column buffer independently, an average gain of the overall column buffer population for each given gain setting can be calibrated; hence, a single calibration coefficient can be generated by the feedback component 150 per each gain setting regardless of the actual number of column buffers included on a chip.

The data store 410 can be, for example, either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM). The data store 410 of the subject systems and methods is intended to comprise, without being limited to, these and any other suitable types of memory. In addition, it is to be appreciated that the data store 410 can be a server, a database, a hard drive, and the like.

Figure 5:
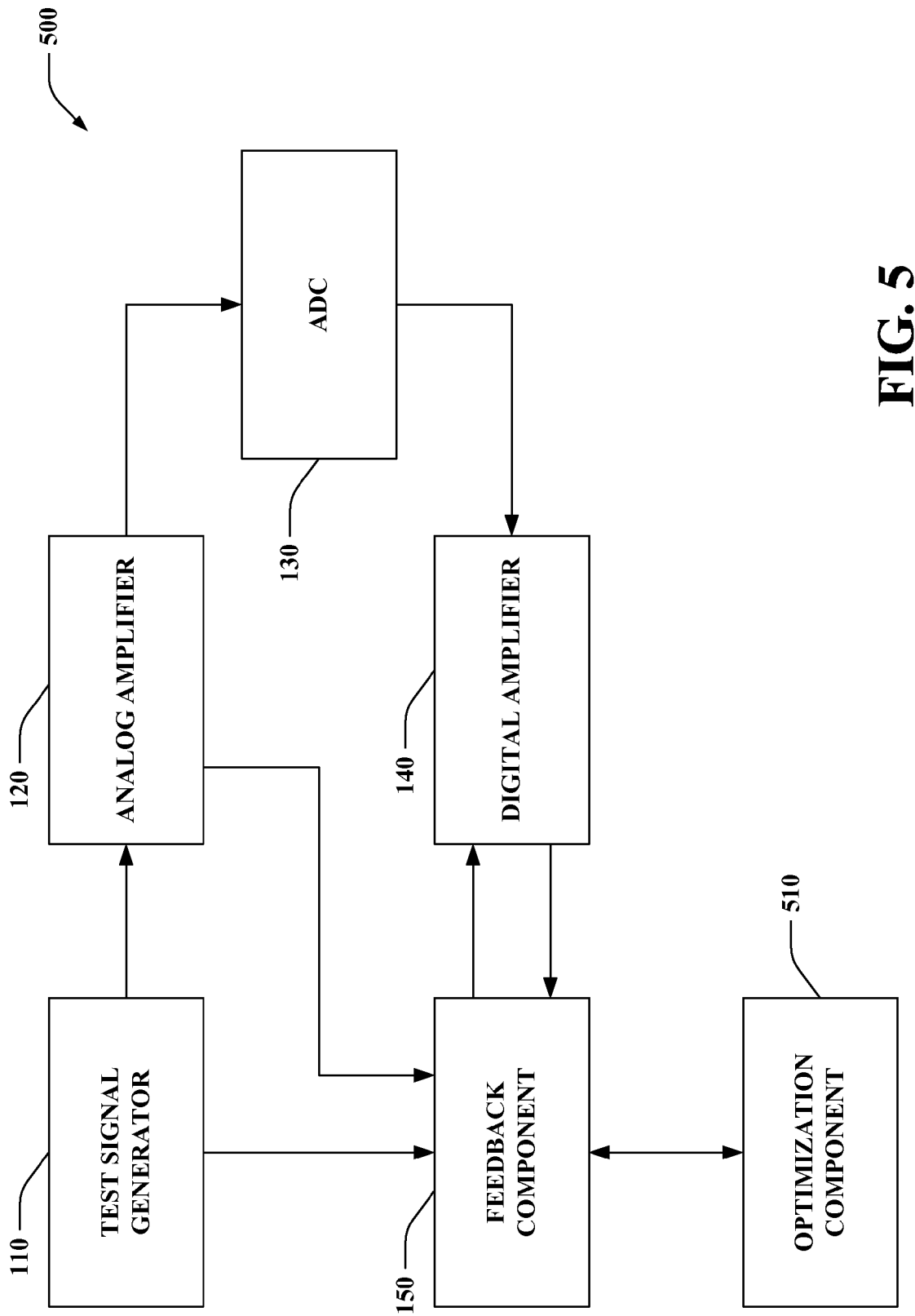
FIG. 5 illustrates a block diagram of an example system that employs feedback data to control resources associated with a CMOS sensor imager.

Now referring to FIG. 5, illustrated is a system 500 that employs feedback data to control resources associated with a CMOS sensor imager. The system 500 can include the test signal generator 110, the analog amplifier 120, the ACD 130, the digital amplifier 140, and/or the feedback component 150 as described above. Moreover, the system 500 can include an optimization component 510 that can be coupled to the feedback component 150. The optimization component 510 can utilize information determined from the feedback component 150 to modify operation of the CMOS sensor imager. When the feedback component 150 determines that the operation of the analog amplifier 120 has changed (e.g., impacting analog gain), the optimization component 510 can effectuate modifying disparate resources of the CMOS sensor imager to compensate for such changes. For example, the feedback component 150 can determine that analog gain dispersion has resulted from an increase in temperature; accordingly, the optimization component 510 can enable altering fan speed to attempt to reduce the temperature and thereby decrease the analog gain dispersion.

Substantially any device, component, process, operating parameter, etc. associated with the CMOS sensor imager can be adjusted by the optimization component 510. For instance, the optimization component 510 can effectuate changes that impact voltage, temperature, humidity, battery life, environmental conditions, etc. Moreover, alterations to CMOS sensor imager related resources brought forth by the optimization component 510 can be carried out in conjunction with (and/or instead of) variations to calibration data employed by the digital amplifier 140 as determined by the feedback component 150.

Figure 6:
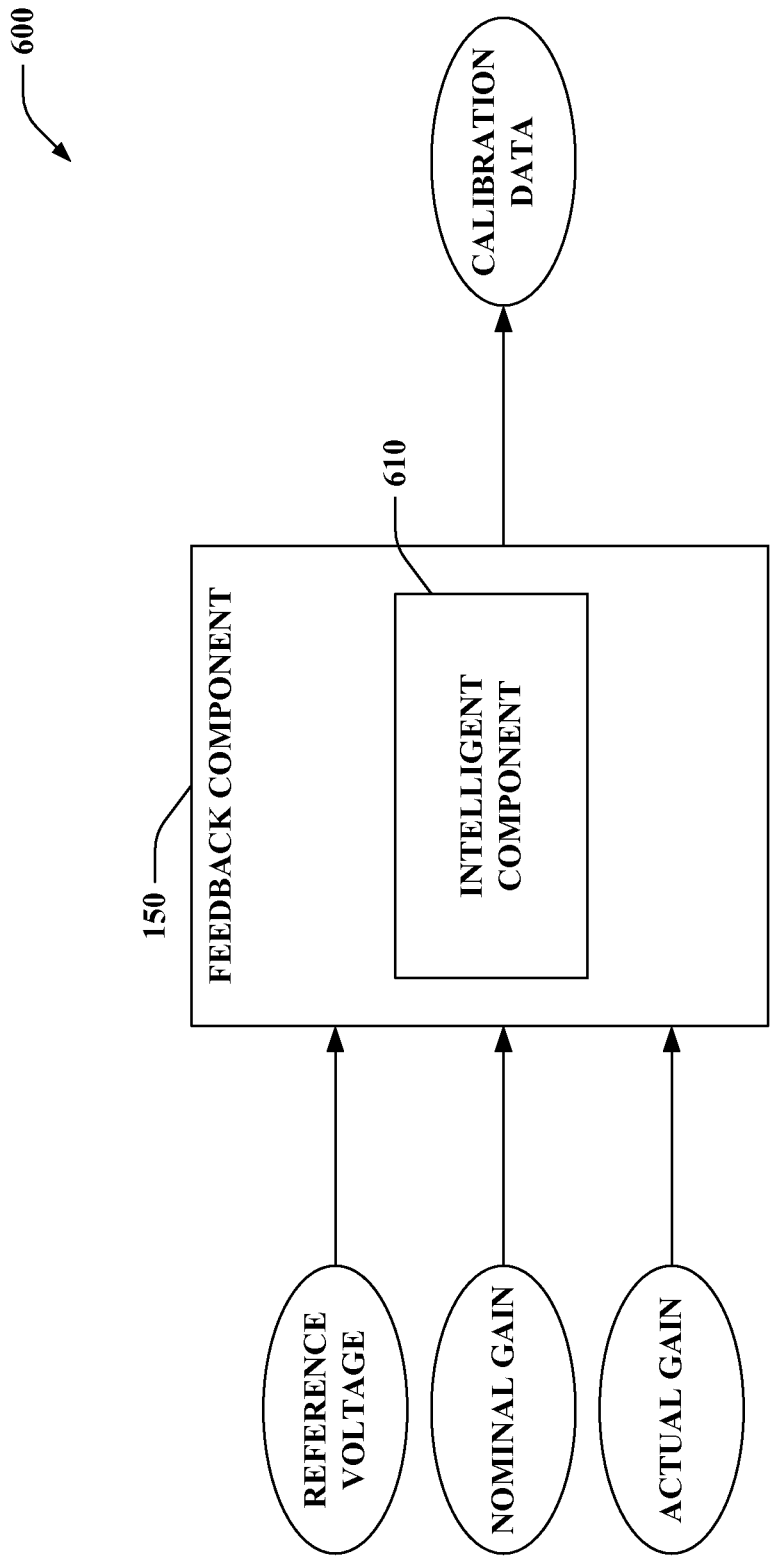
FIG. 6 illustrates a block diagram of an example system that infers whether analog gain discontinuities are introduced by analog amplifier(s) and/or calibration values that can compensate for such analog gain discontinuities.

Turning to FIG. 6, illustrated is a system 600 that infers whether analog gain discontinuities are introduced by analog amplifier(s) and/or calibration values that can compensate for such analog gain discontinuities. The system 600 can include the feedback component 150 (and/or the test signal generator 110, the analog amplifier 120, the ADC 130, and/or the digital amplifier 140), which can be substantially similar to the aforementioned description. The feedback component 150 can further include an intelligent component 610 that can be utilized by the feedback component 150 to reason about whether analog components provide gain dispersion based upon inputted reference voltages, nominal gains to be employed by analog amplifiers, and/or actual gains yielded.

Pursuant to another example, the intelligent component 610 can infer values of calibration data that can be employed by a digital amplifier to mitigate effects of dispersion caused by analog components.

It is to be understood that the intelligent component 610 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g. support vector machines, neural networks, expert systems, Bayesian belief networks, fuzzy logic, data fusion engines . . . ) can be employed in connection with performing automatic and/or inferred action in connection with the claimed subject matter.

A classifier is a function that maps an input attribute vector, $x=(x1, x2, x3, x4, xn)$, to a confidence that the input belongs to a class, that is, $f(x)$=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g. naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

Figure 7:
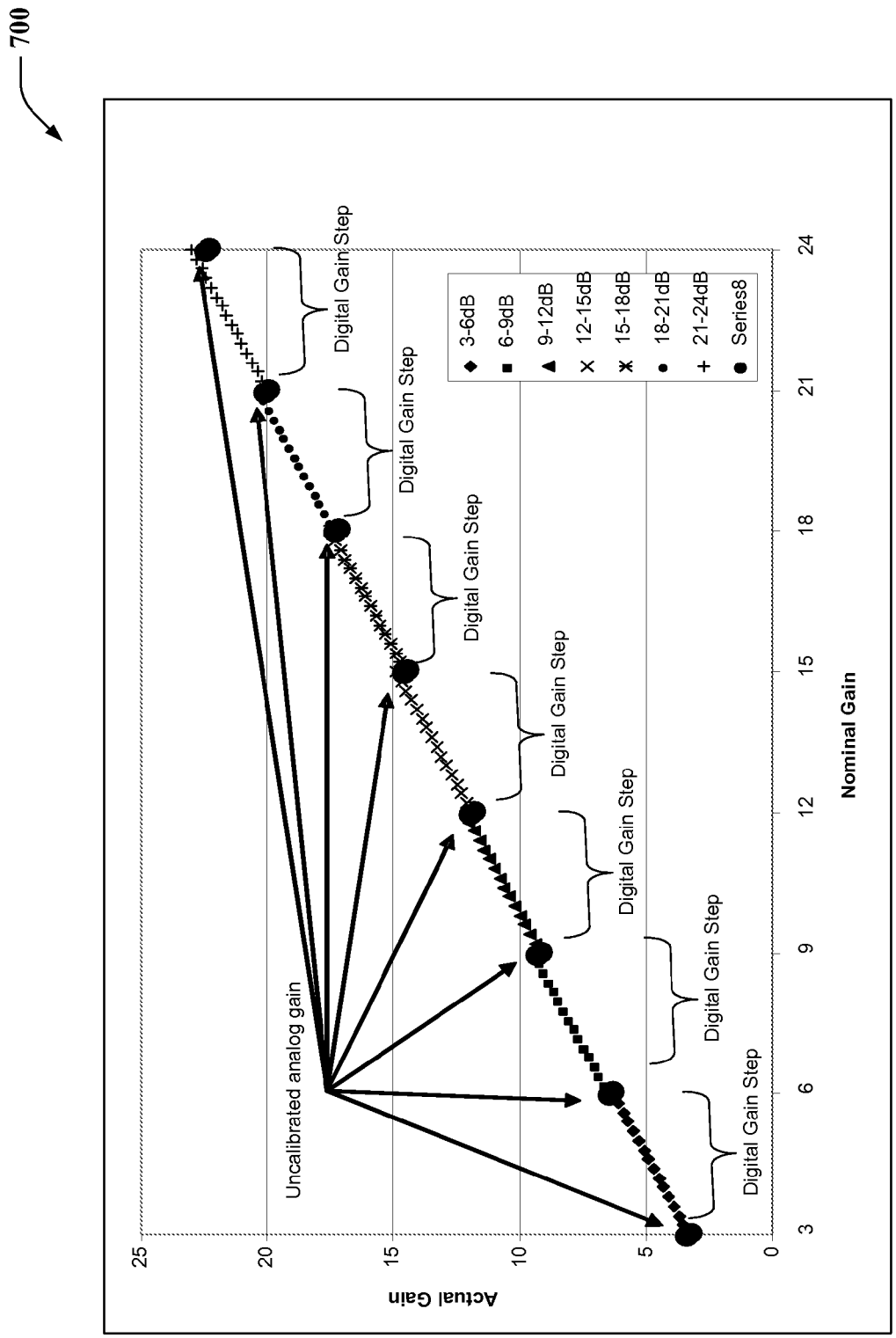
FIGS. 7-10 illustrate example graphs depicting performance of uncalibrated and calibrated CMOS sensor imagers.
Figure 8:
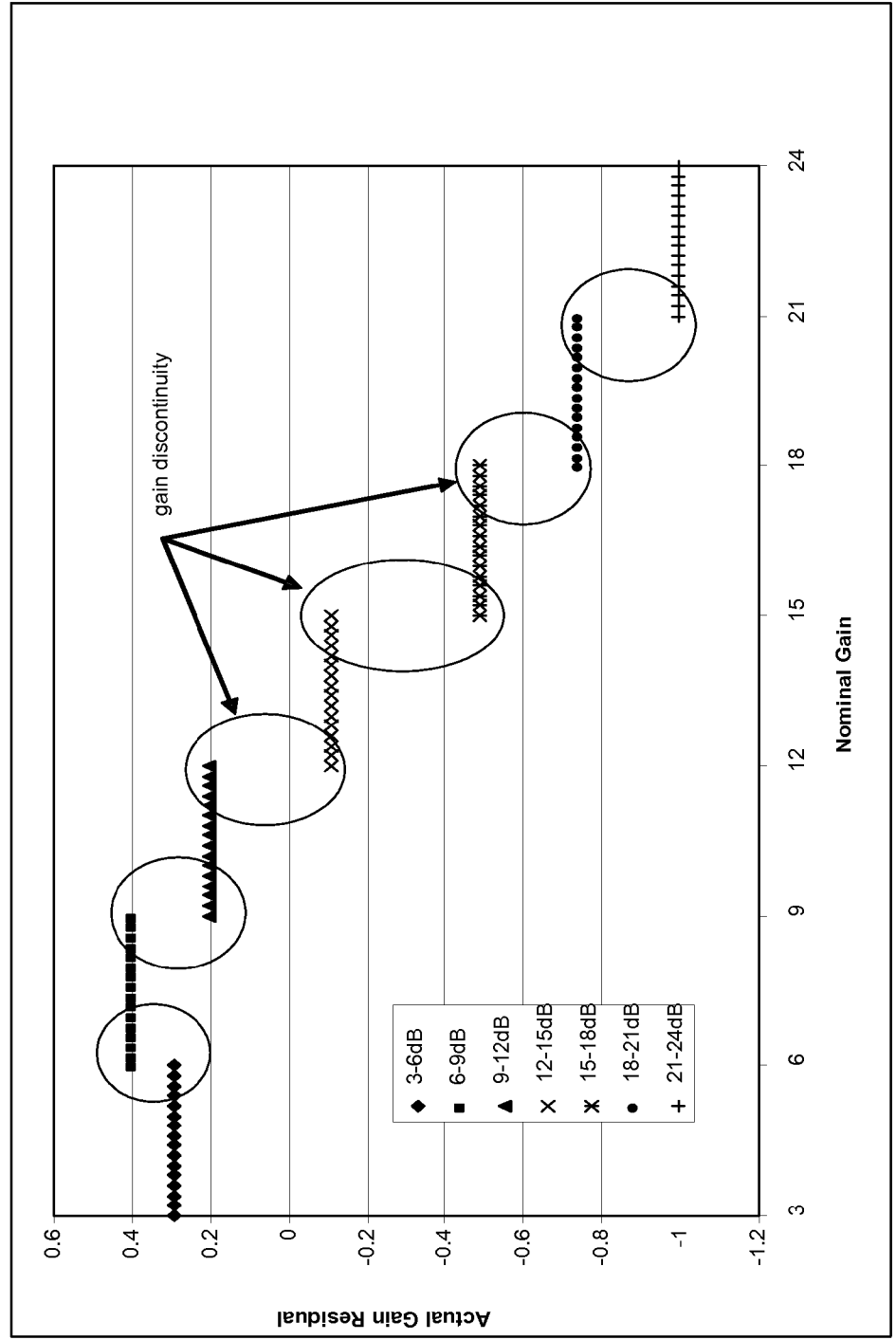

Turning to FIGS. 7-10, illustrated are example graphs depicting performance of uncalibrated and calibrated CMOS sensor imagers. It is to be appreciated that the claimed subject matter is not limited to such examples. With reference to FIG. 7, illustrated is an example graph 700 showing uncalibrated analog gain steps together with digital gain steps. The graph 700 plots nominal gains versus actual gains. The analog gain steps as depicted are 3 dB and the analog range is 24 dB, while the digital gain steps are 0.2 dB and the digital range is 3 dB. The analog gain steps are represented as dots upon the graph 700 and the digital gain steps are in between adjacent analog gain steps. FIG. 8 illustrates a graph 800 showing actual gain residuals from data of FIG. 7. More particularly, the graph 800 plots nominal gains versus actual gain residuals for an example case of using an analog amplifier and a digital amplifier together without analog gain calibration. Gain discontinuities are apparent in the graph 800 in between two adjacent analog gain steps when a new analog gain value is selected and the previous analog gain is deselected.

Figure 9:
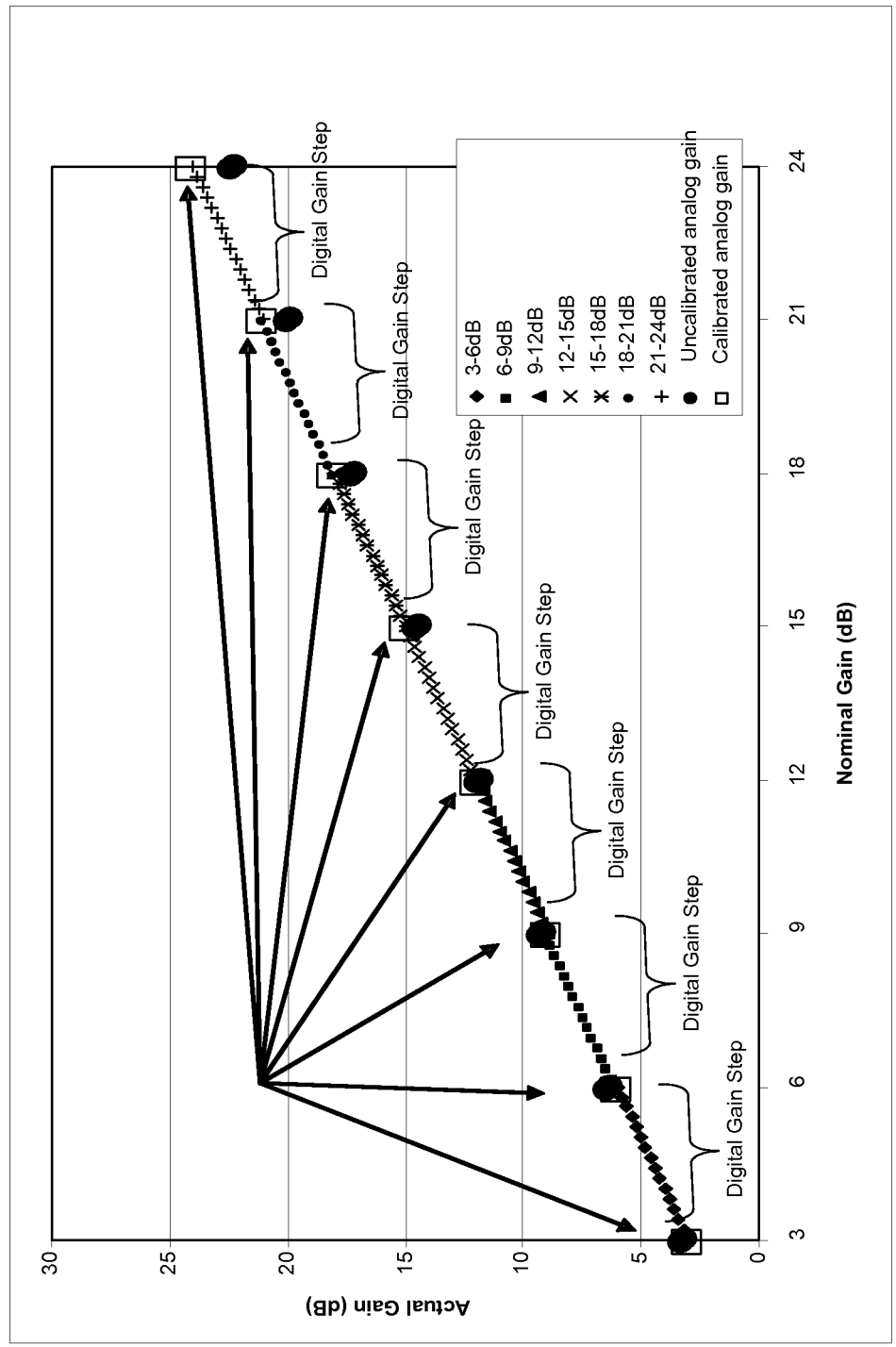
Figure 10:
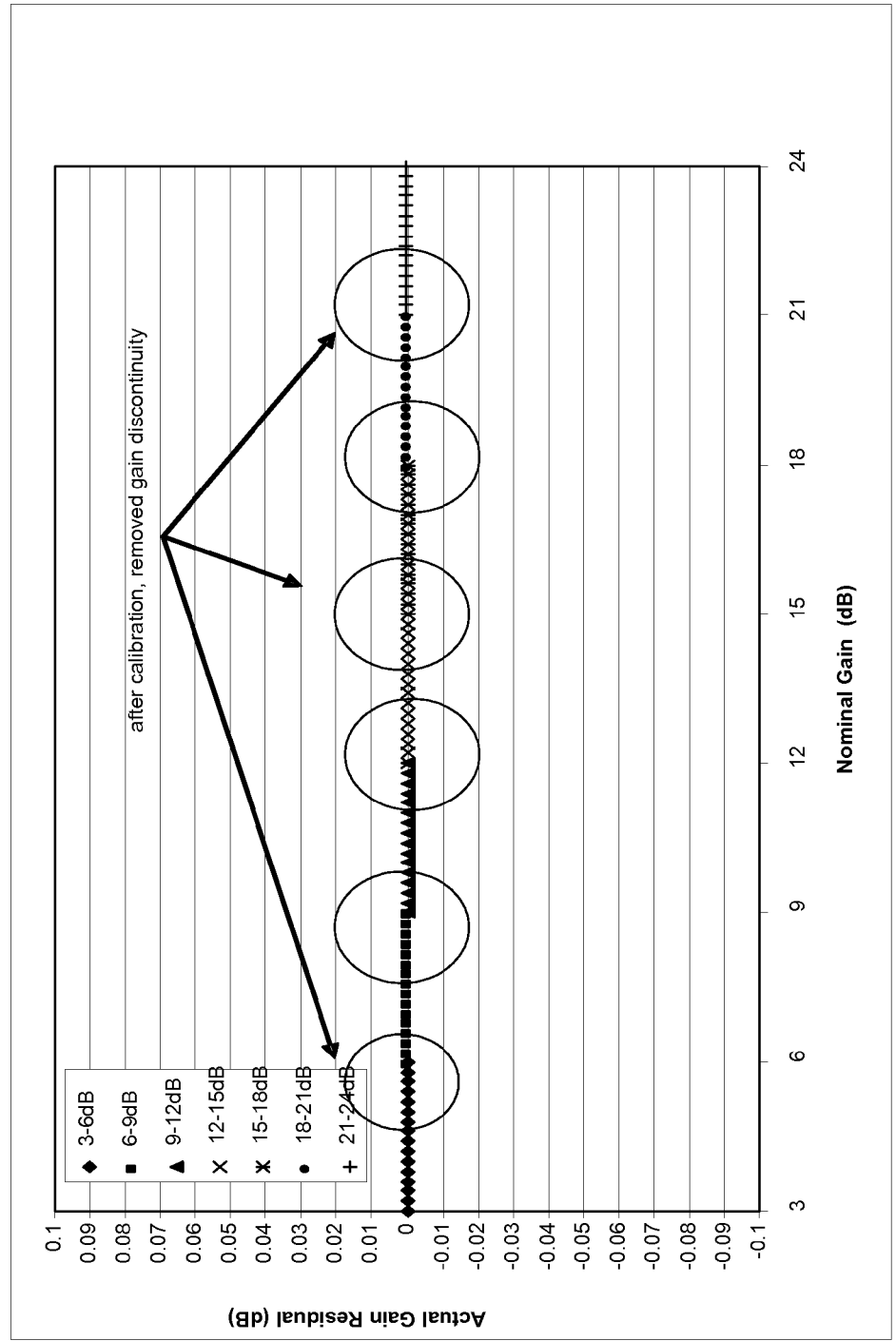

Turning to FIG. 9, illustrated is a post calibration graph 900 with nominal gains versus actual gains. The dots represent the uncalibrated analog gains and the squares depict the calibrated values of the analog gains, while the digital gain steps are in between adjacent analog steps. Thus, digital gain can compensate for variation in the analog gain to mitigate gain discontinuities. On-chip calibration of the analog gain allows for precise measuring of the actual value of each nominal analog gain step on a chip by chip basis. Further, FIG. 10 illustrates a post calibration residual for actual gain versus nominal gain graph 1000. As shown in the graph 1000, the residuals can be zeroed after carrying out calibration techniques described herein.

Figure 11:
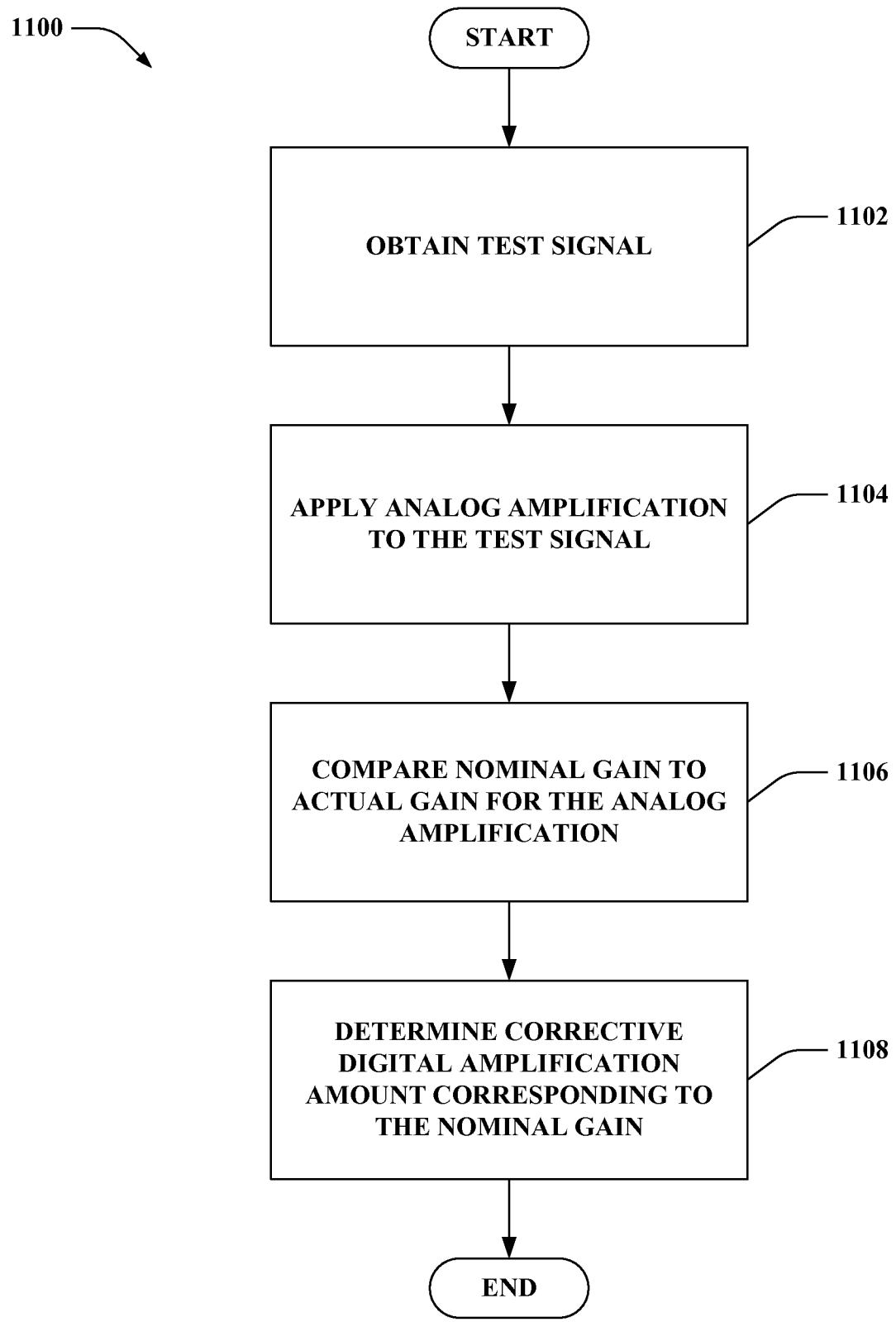
FIG. 11 illustrates an example methodology that facilitates compensating for analog components of a CMOS sensor imager to mitigate gain dispersion.
Figure 12:
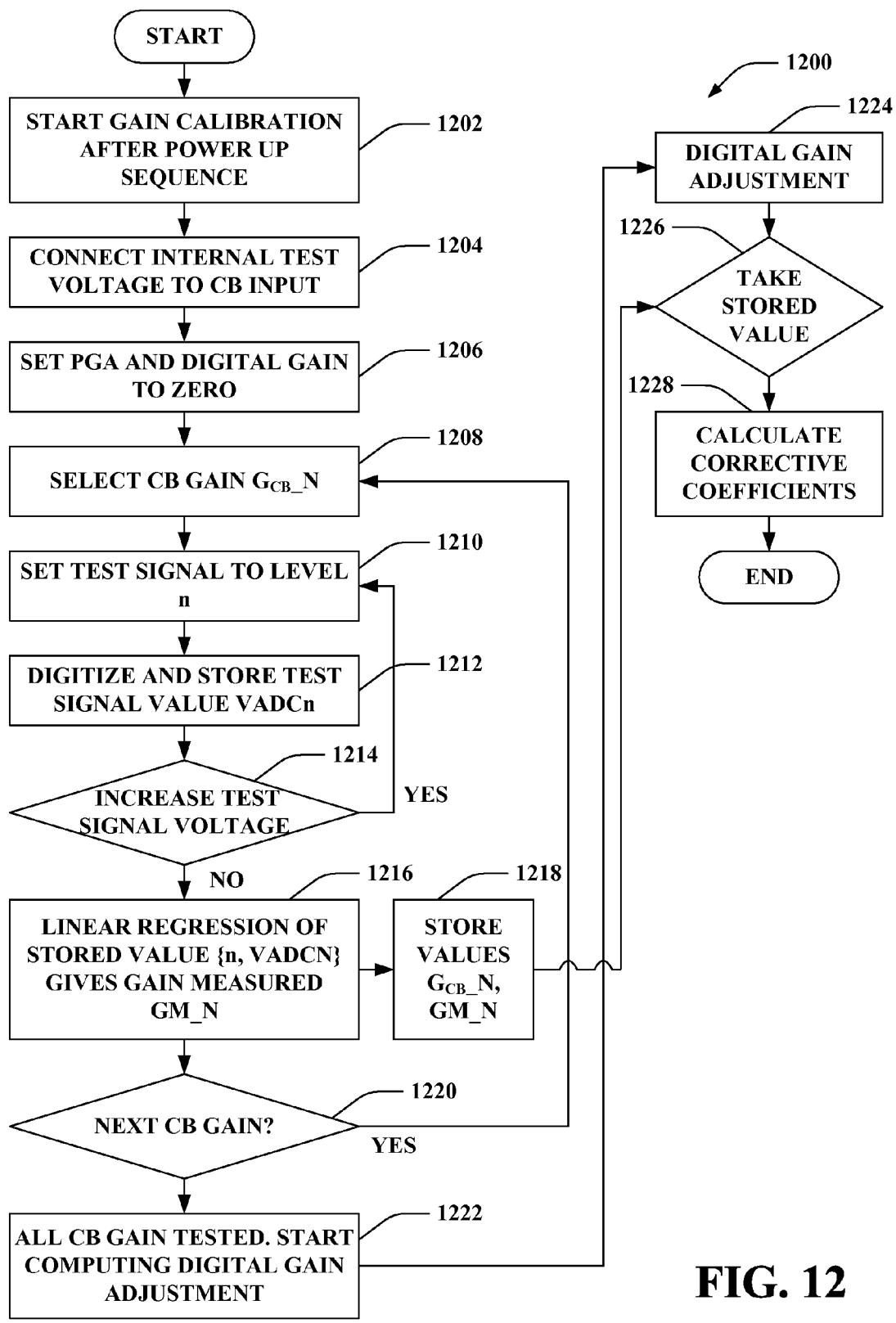
FIG. 12 illustrates an example methodology that facilitates generating calibration coefficients to correct analog gain variations.

FIGS. 11-12 illustrate methodologies in accordance with the claimed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events.

Turning to FIG. 11, illustrated is a methodology 1100 that facilitates compensating for analog components of a CMOS sensor imager to mitigate gain dispersion. At 1102, a test signal can be obtained. For example, the test signal can be one or more reference voltages. According to another illustration, the test signal can be received during a calibration mode associated with the CMOS sensor imager. At 1104, an analog amplification can be applied to the test signal. A nominal gain can be selected for the analog amplification. Moreover, a plurality of test signals (e.g., at disparate reference voltages) can be subject to the analog amplification at a particular nominal gain.

At 1106, nominal gain can be compared to actual gain for the analog amplification. For example, the actual gain related to a particular nominal gain can be determined by analyzing an output voltage corresponding the amplified test signal measured for each test signal. Moreover, linear regression techniques can be employed upon a plurality of output voltages pertaining to distinct test signals to yield the actual gain. At 1108, a corrective digital amplification amount (e.g., corrective digital amplification value) corresponding to the nominal gain can be determined. The corrective digital amplification amount can be retained in memory (e.g., temporarily, permanently, . . . ). Further, the corrective digital amplification amount can be utilized by a digital amplifier of the CMOS sensor imager to mitigate the difference between the actual gain and the nominal gain when capturing video. It is contemplated that the corrective digital amplification amount can be determined during production of the CMOS sensor imager, at power up of the CMOS sensor imager, after a predetermined amount of time of operation of the CMOS sensor imager, upon an occurrence of an event and/or condition, and the like. Moreover, respective corrective digital amplification amounts can be determined for each analog amplifier.

Now referring to FIG. 12, illustrated is a methodology 1200 that facilitates generating calibration coefficients to correct analog gain variations. At 1202, gain calibration can be started after a power up sequence. It is to be appreciated, however, that gain calibration can be effectuated after a predetermined amount of time, upon the occurrence of a condition, etc. Moreover, gain calibration can be performed during chip production. Upon entering a calibration mode, certain components can be switched off (e.g., pixel array need not be employed during calibration, . . . ). At 1204, an internal test voltage can be connected to a column buffer (CB) input. Substantially any number of column buffers can be employed in connection with the claimed subject matter, where each of the column buffers can be utilized with a respective column of a pixel array of the CMOS sensor imager during video capture. At 1206, a programmable gain amplifier (PGA) and a digital gain can be set to zero.

At 1208, CB gain can be selected $G_{CB}$_N (e.g., nominal gain step for the column buffer can be chosen). At 1210, a test signal can be set to level n. The test signal can be obtained from an on-chip source, a separate device, and the like. Moreover, the test signal can be substantially any reference voltage (e.g., input voltage). At 1212, the test signal value VADCn (e.g., amplified output) can be digitized and stored. Thus, the test signal as amplified by the column buffer can be converted to a digital output and retained in memory. At 1214, it can be determined whether to increase the test signal voltage. If the test signal voltage is to be increased, the methodology 1200 returns to 1210. The test signal voltage can be increased to yield additional input/output voltage pairs to decipher an actual analog gain. Thus, a calibration loop per each analog gain step can be provided where a plurality of analog test signals can be coupled to the analog gain stage input and the corresponding digitized outputs can be recorded. If the test signal voltage is not to be increased, the methodology 1200 continues to 1216, where linear regression of stored values of the test signal voltage n and the test signal value VADCn can yield a measured gain GM_N. Accordingly, actual gain can be computed for each nominal gain step by use of, for instance, linear regression performed on the recorded data (e.g., from 1212). At 1218, the values of the nominal column buffer gain $G_{CB}$_N and the actual, measured gain GM_N can be stored. For example, the actual and nominal gains can be retained in a gain lookup table.

At 1220, a determination can be made as to whether to analyze a next column buffer gain (e.g., nominal column buffer gain). If a next column buffer gain is to be evaluated, the methodology returns 1200 to 1208; else, the methodology 1200 continues to 1222. At 1222, upon the column buffer gains being tested, computation of digital gain adjustments can begin. The digital gain adjustments can continue at 1224. At 1226, the stored values (e.g., from 1218) can be obtained. At 1228, corrective coefficients can be calculated. Through utilization of the gain lookup table, digital gain can be coupled to the analog gain such that gain discontinuities can be mitigated. For example, the digital gain can be positive (amplification) and/or negative (attenuation) to correct dispersion values associated with the analog gain. Although FIG. 12 relates to calibrating column buffer gain, it is to be appreciated that similar calibration can be effectuated for any disparate type of analog gain (e.g. associated with the PGA).

According to another example (not shown), a single calibration coefficient associated with the population of column buffers at each gain setting can be generated. Following this example, at 1212, the method 1200 can enable digitizing each column buffer output, averaging the plurality of column buffer outputs, and storing the averaged column buffer output values VADCn. Thus, averaging can be introduced after digitalization to compute a mean output from the set of column buffers and the average value can be stored with the test signal n to mitigate hardware utilization (e.g., reduce memory usage, number of estimation operations, . . . ). Further, a single linear regression estimation can be performed (e.g., at 1216) on the computed average output value that represents the average response of the whole column buffer population of the sensor, rather than computing a linear regression per each column buffer individually.

Figure 13:
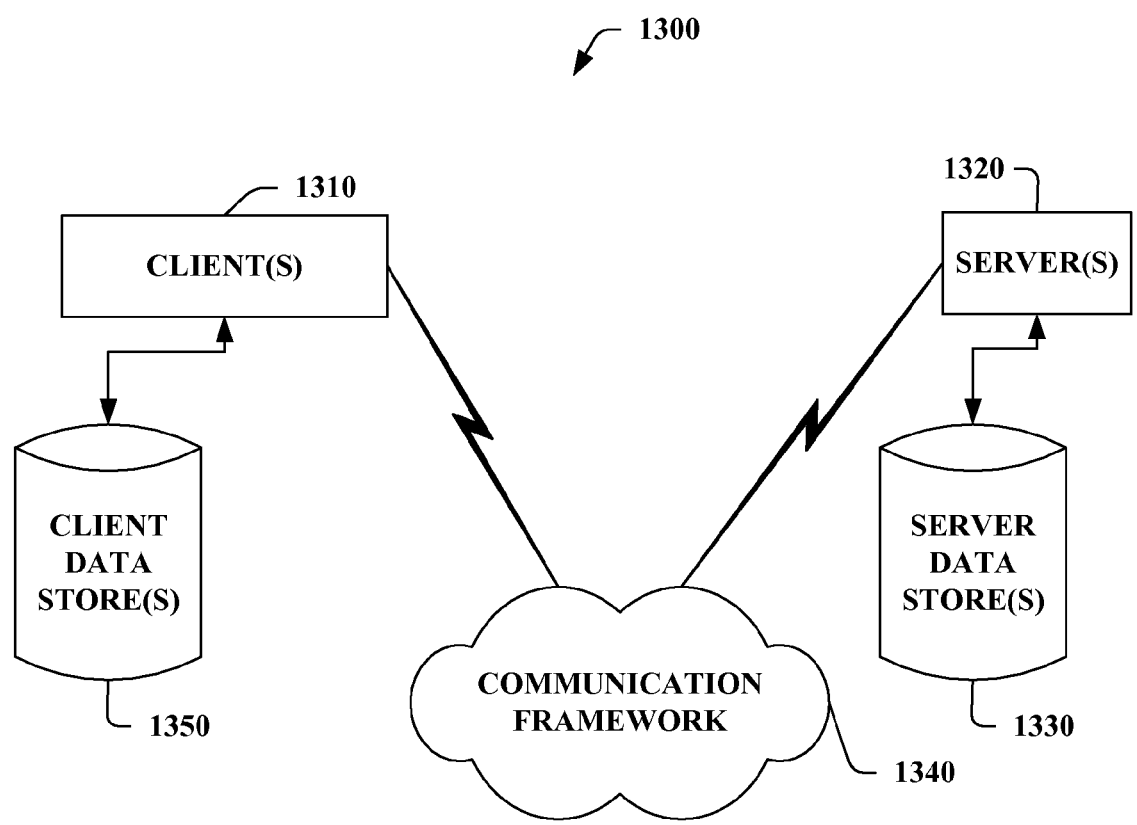
FIG. 13 illustrates an example networking environment, wherein the novel aspects of the claimed subject matter can be employed.
Figure 14:
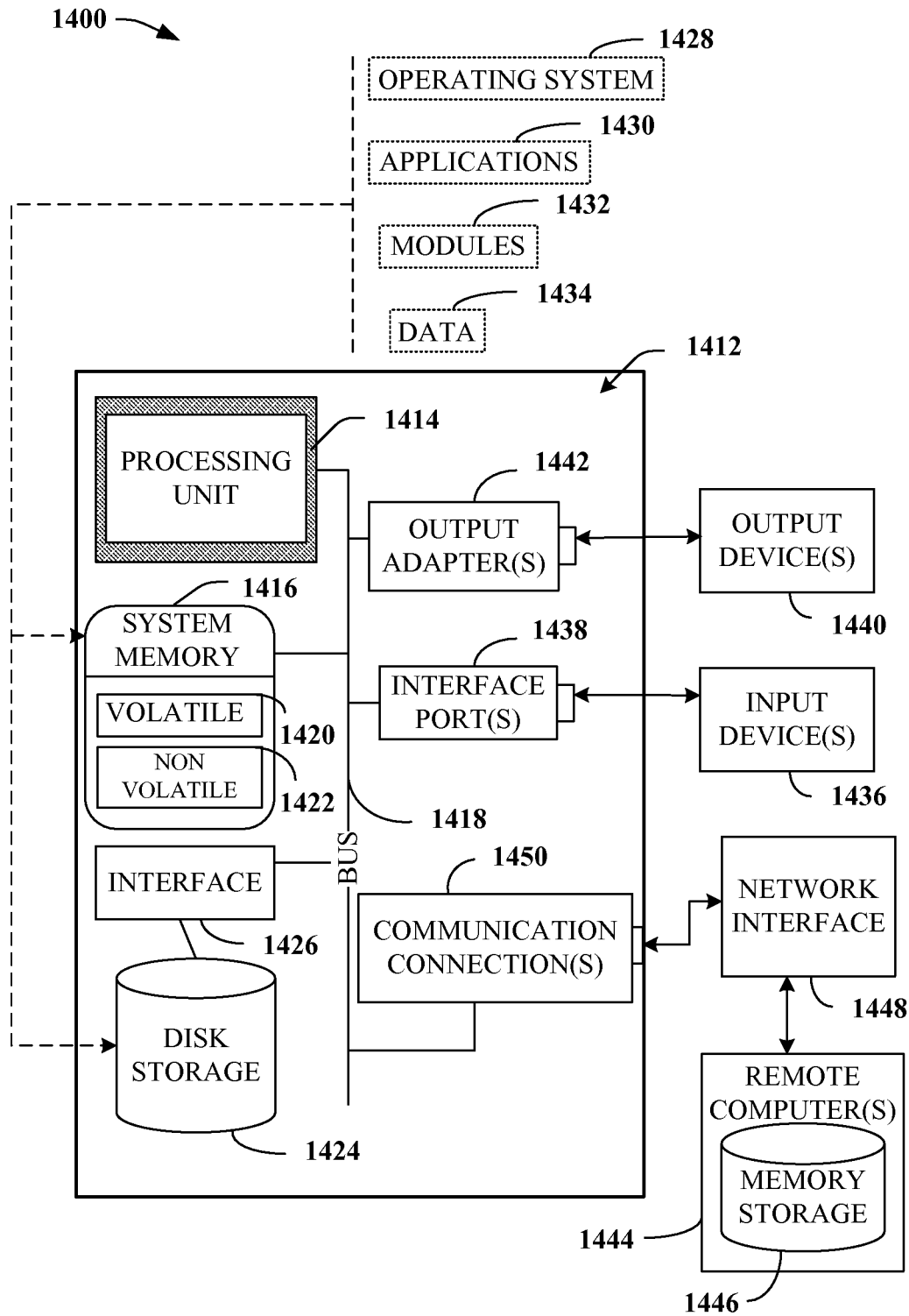
FIG. 14 illustrates an example operating environment that can be employed in accordance with the claimed subject matter.

In order to provide additional context for implementing various aspects of the claimed subject matter, FIGS. 13-14 and the following discussion is intended to provide a brief, general description of a suitable computing environment in which the various aspects of the subject innovation may be implemented. For instance, FIGS. 13-14 set forth a suitable computing environment that can be employed in connection with calibrating and/or utilizing calibrated amplification associated with CMOS sensor imagers. While the claimed subject matter has been described above in the general context of computer-executable instructions of a computer program that runs on a local computer and/or remote computer, those skilled in the art will recognize that the subject innovation also may be implemented in combination with other program modules. Generally, program modules include routines, programs, components, data structures, etc., that perform particular tasks and/or implement particular abstract data types.

Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based and/or programmable consumer electronics, and the like, each of which may operatively communicate with one or more associated devices. The illustrated aspects of the claimed subject matter may also be practiced in distributed computing environments where certain tasks are performed by remote processing devices that are linked through a communications network. However, some, if not all, aspects of the subject innovation may be practiced on stand-alone computers. In a distributed computing environment, program modules may be located in local and/or remote memory storage devices.

FIG. 13 is a schematic block diagram of a sample-computing environment 1300 with which the claimed subject matter can interact. The system 1300 includes one or more client(s) 1310. The client(s) 1310 can be hardware and/or software (e.g., threads, processes, computing devices). The system 1300 also includes one or more server(s) 1320. The server(s) 1320 can be hardware and/or software (e.g., threads, processes, computing devices). The servers 1320 can house threads to perform transformations by employing the subject innovation, for example.

One possible communication between a client 1310 and a server 1320 can be in the form of a data packet adapted to be transmitted between two or more computer processes. The system 1300 includes a communication framework 1340 that can be employed to facilitate communications between the client(s) 1310 and the server(s) 1320. The client(s) 1310 are operably connected to one or more client data store(s) 1350 that can be employed to store information local to the client(s) 1310. Similarly, the server(s) 1320 are operably connected to one or more server data store(s) 1330 that can be employed to store information local to the servers 1320.

With reference to FIG. 14, an exemplary environment 1400 for implementing various aspects of the claimed subject matter includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1416 includes volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable programmable ROM (EEPROM), or flash memory. Volatile memory 1420 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1412 also includes removable/non-removable, volatile/non-volatile computer storage media. FIG. 14 illustrates, for example a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used such as interface 1426.

It is to be appreciated that FIG. 14 describes software that acts as an intermediary between users and the basic computer resources described in the suitable operating environment 1400. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the claimed subject matter can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port may be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

What has been described above includes examples of the subject innovation. It is, of course, not possible to describe every conceivable combination of components or methodologies for purposes of describing the claimed subject matter, but one of ordinary skill in the art may recognize that many further combinations and permutations of the subject innovation are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable medium having computer-executable instructions for performing the acts and/or events of the various methods of the claimed subject matter.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system that calibrates gain associated with a sensor imager, comprising:
    a plurality of analog amplifiers configured to, for a plurality of nominal analog gain settings, obtain and amplify a test signal during calibration to yield amplified outputs respectively corresponding to the plurality of analog amplifiers, wherein the plurality of analog amplifiers comprise a plurality of column buffers;
    a digital amplifier configured to adjust the amplified outputs based upon a calibration to compensate for mismatch introduced by the plurality of analog amplifiers; and
    a feedback component configured to, for each nominal analog gain setting of the plurality of nominal analog gain settings, compare the nominal analog gain setting with an average of actual analog gains respectively measured for the plurality of column buffers set to the nominal analog gain setting to yield a plurality of calibration values respectively corresponding to the plurality of nominal analog gain settings, and to control the calibration of the digital amplifier based upon at least one of the plurality of calibration values.

2. The system of claim 1, further comprising an analog-to-digital converter configured to digitize the amplified outputs to yield a digitized amplified output and to provide the digitized amplified output to the digital amplifier.

3. The system of claim 1, further comprising a test signal generator configured to yield the test signal.

4. The system of claim 1, wherein the plurality of column buffers each amplify a signal from a respective column of a pixel array.

5. The system of claim 4, further comprising at least one programmable gain amplifier configured to amplify an output from the plurality of column buffers.

6. The system of claim 1, wherein the feedback component is further configured to control calibration corresponding to each of the plurality of analog amplifiers.

7. The system of claim 1, wherein the digital amplifier is further configured to generate finer gain steps than the plurality of analog amplifiers.

8. The system of claim 1, wherein the feedback component is further configured to perform the calibration as part of a chip power up sequence.

9. The system of claim 1, wherein the feedback component is further configured to perform the calibration after a predetermined amount of sensor operating time.

10. The system of claim 1, wherein the feedback component is further configured to receive the amplified outputs and to determine the actual analog gains based on the amplified outputs.

11. The system of claim 1, wherein the feedback component is further configured to employ linear regression to determine the actual analog gains.

12. The system of claim 1, wherein the feedback component is further configured to retain the plurality of calibration values in a data store for retrieval by the digital amplifier during video capture, wherein each calibration value of the plurality of calibration values is associated, in the data store, with the nominal analog gain setting used to determine the calibration value.

13. The system of claim 1, further comprising an optimization component configured to utilize information determined by the feedback component to modify a resource associated with the sensor imager.

14. The system of claim 1, further comprising a data store comprising a lookup table that maintains the plurality of calibration values in association with the plurality of nominal analog gain settings, wherein the feedback component is further configured to retrieve the at least one of the plurality of calibration values from the lookup table during operation of the sensor imager based on a value of the nominal analog gain setting.

15. A method that facilitates compensating for variation associated with analog components of a sensor imager, comprising:
    applying analog amplification to test signals from a plurality of column buffers set to a nominal gain setting to yield a plurality of amplified analog outputs respectively associated with the plurality of column buffers;
    averaging actual gains of the plurality of amplified analog outputs to yield an average gain for the plurality of column buffers;
    comparing the nominal gain setting of the analog amplification to the average gain;
    determining, based on the comparing, a corrective digital amplification value corresponding to the nominal gain setting; and
    performing the applying, the averaging, the comparing, and the determining for a plurality of different nominal gain settings to determine respective corrective digital amplification values for the plurality of different nominal gain settings; and
    storing the corrective digital amplification values in association with the plurality of different nominal gain settings for calibration of a digital amplifier.

16. The method of claim 15, further comprising determining the actual gains based on output voltages of the amplified analog outputs.

17. The method of claim 15, further comprising:
    applying the analog amplification to a plurality of test signals at the nominal gain setting;
    digitizing amplified outputs from the analog amplification respectively corresponding to the plurality of test signals to yield digitized amplified outputs; and
    analyzing the digitized amplified outputs to determine at least one of the actual gains by employing a linear regression technique upon the digitized amplified outputs and the corresponding plurality of test signals.

18. The method of claim 15, wherein the storing comprises storing the corrective digital amplification values in a lookup table in association with the respective plurality of different nominal gain settings the respective plurality of nominal gains.

19. A system that enables calibrating gain associated with a sensor imager, comprising:
    means for amplifying a test signal according to a nominal analog gain setting of a plurality of column buffers to yield respective amplified analog signals for the plurality of column buffers;

means for comparing an average analog gain measured for the amplified analog signals from the plurality of column buffers with the nominal analog gain setting to yield a calibration coefficient; and means for storing a plurality of calibration coefficients, including the calibration coefficient, respectively corresponding to a plurality of different nominal analog gain settings for utilization by a digital amplifier to correct a difference between the nominal analog gain setting and the average analog gain.

20. The system of claim 19, further comprising means for storing the plurality of calibration coefficients in a lookup table that respectively associates the plurality of calibration coefficients with the plurality of different nominal analog gain settings.

* * * * *